United States Patent
Vieux et al.

(10) Patent No.: US 6,354,595 B1
(45) Date of Patent: Mar. 12, 2002

(54) METHOD FOR TIGHT SEALING OF A RADIATION DETECTOR AND DETECTOR OBTAINED BY THIS METHOD

(75) Inventors: Gérard Vieux, Froges; Vincent Spinnler, Voreppe, both of (FR)

(73) Assignee: Thomson Tubes Electroniques, Meudon la Foret (FR)

( * ) Notice: Subject to any disclaimer, the term of this patent is extended or adjusted under 35 U.S.C. 154(b) by 0 days.

(21) Appl. No.: 09/341,144

(22) PCT Filed: Jan. 20, 1998

(86) PCT No.: PCT/FR98/00098

§ 371 Date: Jul. 16, 1999

§ 102(e) Date: Jul. 16, 1999

(87) PCT Pub. No.: WO98/32179

PCT Pub. Date: Jul. 23, 1998

(30) Foreign Application Priority Data

Jan. 21, 1997 (FR) .............................................. 97 00590

(51) Int. Cl.[7] .......................... H01L 23/48; H01L 21/50
(52) U.S. Cl. ........................ 277/312; 257/688; 257/693; 257/788; 438/112; 438/127
(58) Field of Search ................................ 277/312, 630; 257/688, 668–673, 687, 693, 700, 728, 738, 788–796; 438/106–127

(56) References Cited

U.S. PATENT DOCUMENTS

| 4,329,701 A | * | 5/1982 | Brenneman | 357/28 |
|---|---|---|---|---|
| 4,543,485 A | * | 9/1985 | Ishii et al. | 250/487.1 |
| 5,006,714 A | * | 4/1991 | Attix | 250/368 |
| 5,179,284 A | * | 1/1993 | Kingsley et al. | 250/370.11 |
| 5,201,456 A | | 4/1993 | De Reynal et al. | |
| 5,216,278 A | * | 6/1993 | Lin et al. | 257/688 |
| 5,220,198 A | * | 6/1993 | Tsuji | 257/731 |
| 5,227,663 A | * | 7/1993 | Patil et al. | 257/718 |
| 5,381,014 A | | 1/1995 | Lothar et al. | |
| 5,557,148 A | * | 9/1996 | Cain | 257/777 |
| 5,859,475 A | * | 1/1999 | Freyman et al. | 257/738 |
| 5,869,886 A | * | 2/1999 | Tokuno | 257/678 |
| 5,932,927 A | * | 8/1999 | Koizumi et al. | 257/728 |
| 5,952,714 A | * | 9/1999 | Sano et al. | 257/680 |
| 6,054,759 A | * | 4/2000 | Nakamura | 257/691 |

FOREIGN PATENT DOCUMENTS

| EP | 0 528 676 | 2/1993 |
|---|---|---|
| EP | 0 529 981 | 3/1993 |

* cited by examiner

*Primary Examiner*—Anthony Knight
*Assistant Examiner*—Alison K. Pickard
(74) *Attorney, Agent, or Firm*—Oblon, Spivak, McClelland, Maier & Neustadt, P.C.

(57) ABSTRACT

A process for leaktight sealing of a solid-state X-radiation detector. The detector includes an amorphous silicon detecting slab and a layer of scintillating substance. The slab has peripheral connection zones formed by the flexing of an anisotropic conducting film on the ends of conductive tracks arranged on the slab and external conductors. The flexing zone and at least the periphery of the scintillating layer are covered with an uninterrupted layer of impermeable material, for example by screen printing.

3 Claims, 2 Drawing Sheets

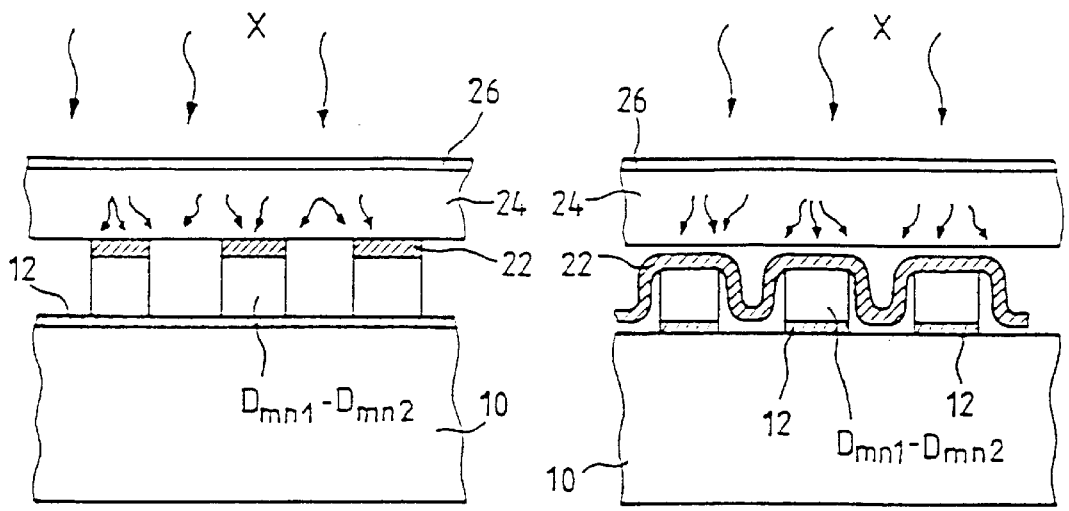
FIG_1a PRIOR ART
FIG_1b PRIOR ART
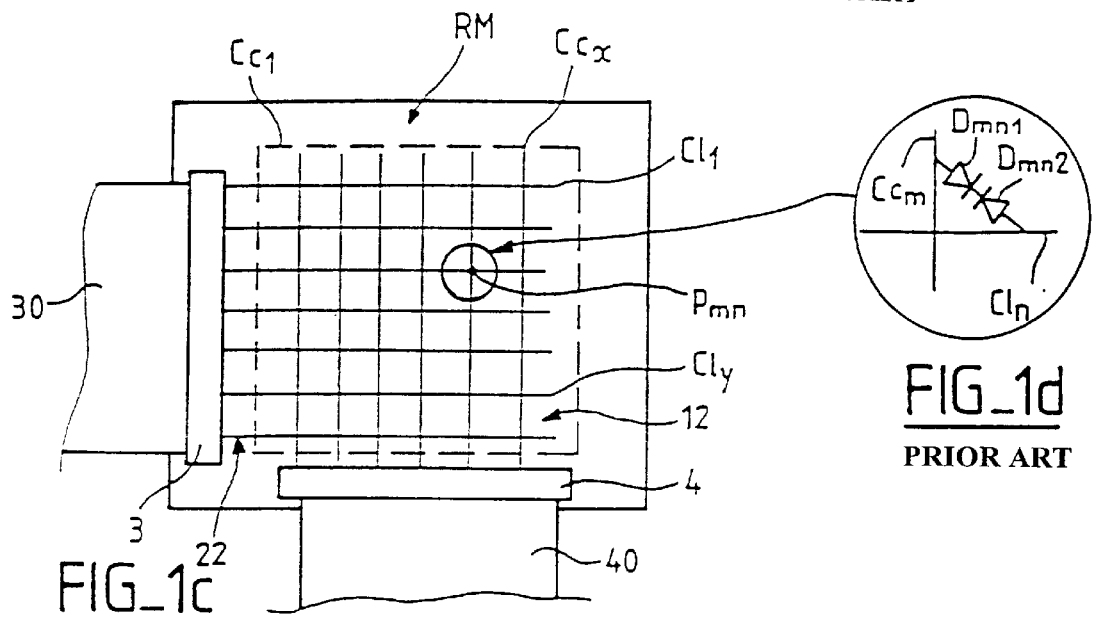
FIG_1c PRIOR ART
FIG_1d PRIOR ART
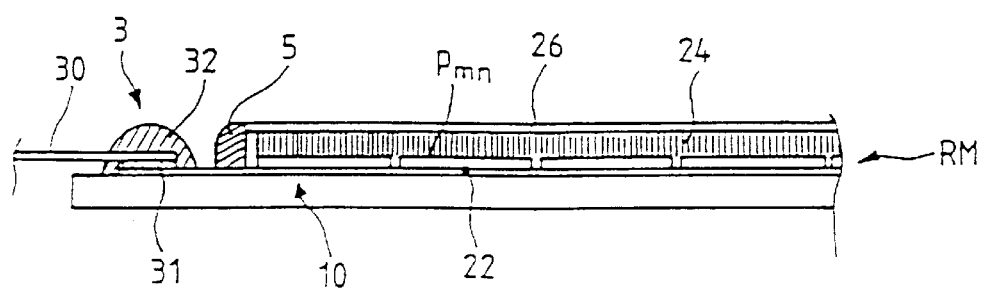
FIG_1e PRIOR ART

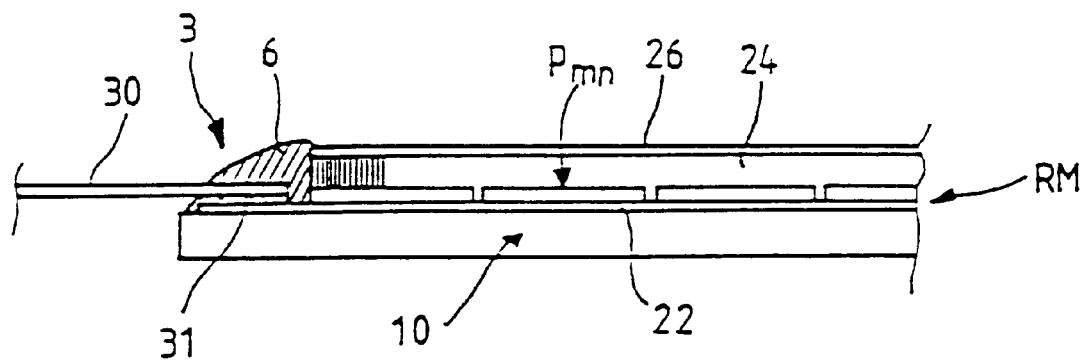
FIG_2
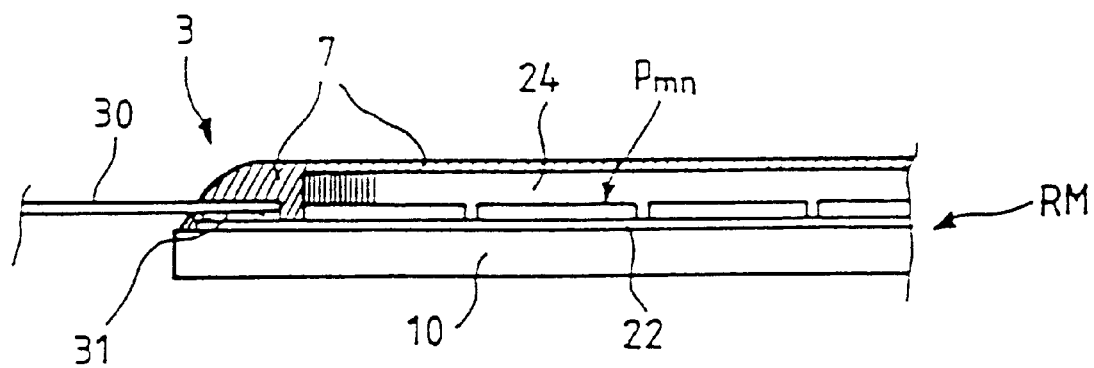
FIG_3

METHOD FOR TIGHT SEALING OF A RADIATION DETECTOR AND DETECTOR OBTAINED BY THIS METHOD

BACKGROUND OF THE INVENTION

FIELD OF THE INVENTION

The present invention relates to a process for leaktight sealing of a radiation detector and, more particularly, of a radiological matrix detector of large size consisting of a glass slab covered with amorphous silicon, the amorphous silicon constituting the active material of the elementary detectors of the detection matrix.

It also relates to a radiological radiation detector sealed according to this process.

The invention applies to detectors for radiation with very short wavelengths, and more particularly to the X-radiation used in radiology.

DISCUSSION OF THE BACKGROUND

According to the state of the art, radiation detectors are produced on the basis of a matrix of solid-state photosensitive elements. Known solid-state photosensitive elements are not directly sensitive to rays with very short wavelengths, for example X-rays. It is necessary to combine them with a scintillator component. The latter is made from a substance which has the property, when it is excited by these X-rays, of emitting light in a longer-wavelength range, in the visible spectra (or the near-visible spectrum). The specific wavelength depends on the substance used. The scintillator therefore acts as a wavelength converter. Visible light thus generated is sent to the photosensitive elements which perform photoelectric conversion of the received light energy into electric signals which can be processed by suitable electronic circuits.

A scintillator according to the prior art is described, by way of nonlimiting example, in French Patent Application FR-A-2 636 800 (THOMSON-CSF).

FIGS. 1a to 1e, appended to the present description, illustrate the mode of operation of a matrix radiation detector of large size according to the prior art, formed by a glass slab covered with amorphous silicon. More particularly, FIG. 1e shows a practical structural example of such a detector. The dimensions of the detector are typically from one or several tens of centimetres side length, it being moreover possible for the detector to be formed by a plurality of glass slabs butted together when the dimensions are particularly large.

FIGS. 1a and 1ba represent two mutually orthogonal lateral sections of a matrix of photosensitive elements which is conventionally combined with a sheet of scintillating substance.

Each photosensitive element has a photodiode or a phototransistor which is sensitive to photons in the visible spectrum or the near-visible spectrum. By way of example, as illustrated in FIGS. 1a to 1d, each photosensitive element consists, for example, of two diodes, $D_{mn1}$ and $D_{mn2}$, arranged head-to-tail, and the matrix array RM has column conductors, $Cc_1$ to $Cc_x$, and row conductors ($Cl_1$ to $Cl_y$. Each of the diodes, $D_{mn1}$ and $D_{mn2}$, constitutes, in a known way, a capacitor when it is reverse-biased. The first diode, $D_{mn1}$, has a capacitance typically ten times smaller than the capacitance of the second diode, $D_{mn2}$. It principally fulfils the function of a switch, whereas the second diode is preferentially photodetecting.

At each intersection of a row and of a column, for example of row $Cl_n$ and column $Cc_m$ (see FIG. 1d), such a set of two diodes head-to-tail, $D_{mn1}$ and $D_{mn2}$, is arranged. The diodes, made of amorphous silicon, may be replaced by transistors produced using "TFT" technology (Thin Film Transistor), also based on amorphous silicon.

The conductors 12 (FIGS. 1a and 1b) are formed by a metal deposit on an insulating substrate 10, preferably glass, The deposition is followed by a photo-etching operation in order to obtain parallel conductive tracks of suitable width. The diodes (for example $Dmn_1$ and $Dmn_2$) are formed by deposition, on the column conductive tracks 12, then etching, of the layers of amorphous silicon (aSi) which is-intrinsic or doped using semiconductor materials of the P or N type. A very thin layer of preferably transparent conducting material is deposited on the insulating layer 20 so as to form, after etching, the row conductive tracks 22 of the matrix array RM.

The assembly described above forms what is generally referred to as an "amorphous silicon slab". The substrate of the slab is in principle glass because of the low cost of this material.

The row conductors, $Cl_1$–$Cl_x$, and the column conductors, $Cc_1$–$Cc_y$, constitute the polarization electrodes of the diode capacitors. The latter store electric charges when they are subjected to light radiation and deliver an electric signal, proportional to the stored charge, when they are electrically polarized. The row conductors, $Cl_1$–$Cl_x$, and the column conductors $Cc_1$–$Cc_y$, are addressed according to a suitable time sequence so that all the pixels $p_{mn}$ are sequentially polarized in a predetermined order. The signal delivered by each pixel $p_{mn}$ is thus recovered and processed by electronic circuits (not shown) so as to reconstruct (point by point) the image stored in the form of electric charges.

The signals are recovered in respective connection zones, 3 and 4, for the rows, $Cl_1$–$Cl_x$, and the columns, $Cc_1$–$Cc_y$. The connections to the electronic circuits may be made using flexible multiconductor cables, 30 and 40, respectively. The flexible multiconductor cables have their ends fixed by adhesive bonding or soldering or, preferably, by hot-pressing to the peripheral connection zones. More precisely, they are usually made using a flexing process, that is to say by hot-pressing an anisotropic conducting film, referred to below as "ACF", between contact pads located on the glass slab (substrate 10) and corresponding pads located on an external flexible cable 30. The conducting pads may be produced on the slab by vacuum deposition. The ACF has the feature of exhibiting electrical conduction after hot-pressing, but only in the axis of the exerted pressure. Along the other axes, the electrical insulation is preserved.

After flexing, the ACF needs to be protected from the external environment in order to preserve its adhesion and electrical-conductivity properties, in particular in severe ambient conditions: humid heat, for example. More generally, whatever the fastening method and the nature of the flexible cable, the end of the flexible multiconductor cable needs to be protected in the connecting zone.

As has been indicated, the photosensitive elements need to be illuminated with visible light (or light in a range close to visible light). It is necessary to provide a scintillator which converts the X-rays into light energy in the visible spectrum. To that end, it is sufficient to cover the above-described amorphous silicon slab with a layer of scintillating substance 24. By way of example, for a detector sensitive to X-rays of the order of 60 keV, the scintillating substance used is cesium iodide (CsI) doped with sodium iodide (NaI) or with thallium iodide (TiI), depending on whether the intention is to obtain a light signal with wavelength 390 nm or 550 nm, respectively. The layer of scintillating substance 24 is generally produced by a vacuum evaporation. The latter operation is generally followed by annealing of the layer, which allows uniform diffusion of the dopant through the structure made of cesium iodide. The diffusion thus obtained makes it possible to optimize the conversion of the X-rays into visible light.

The simplest method for producing a scintillator consists in depositing a cesium iodide layer on a substrate whose nature is unimportant, of annealing it in order to obtain luminescence properties and of attaching this scintillator assembly to the slab described above. More precisely, this attached scintillator may either be pressed against the slab or optically coupled by adhesive bonding.

The scintillator, which is by nature hygroscopic, absolutely needs to be protected from the external environment, in order to preserve the luminescence properties. This protection may be formed by insulating the scintillator from the external atmosphere by leaktight sealing at the periphery of the substrate of the scintillator. The substrate may be fixed on the slab by a bead of adhesive impermeable to moisture. The substrate, through its impermeability, also contributes to the protection of the scintillator.

The performance obtained with a scintillator thus produced is, however, mediocre especially in terms of resolution. This is because an effect is observed whereby the visible light output by the scintillator is refracted, either in the thickness of the adhesive in the case of coupling to the slab, or in the thickness of the air layer which is difficult to control in the case of pressing onto the slab.

A superior method for producing the scintillator, still in terms of resolution, consists in producing it by direct evaporation of material onto the slab. This solution has the advantage of obtaining a scintillator in intimate contact with the slab. The scattering of light at the scintillator/slab interface and the loss of resolution which result therefrom are minimized.

The protection of the scintillator may then be formed in the following way: an X-ray input window 26 is pressed onto the layer of scintillating substance 24. This window is formed on the basis of a material such as aluminium, a plastic material or any other suitable material which is transparent to X-rays. Leaktight sealing is produced as before. The input window and the sealing bead also contribute to this protection.

FIG. 1e illustrates, in section, the partial structure of a detector according to the prior art, of the type which has just been summarized.

The conventional chronological sequence of the operations is as follows:

a/ the scintillator (layer 24) is firstly deposited on a substrate 26;

b/ the leaktight seal 5 of the substrate 26 on the slab 10 supporting the photosensitive elements (defining the pixels $p_{mn}$) and the row 22 and column (not shown) conductors are produced;

c/ the operation of electrical connection by flexing is carried out: zone 31;

d/ the protection of the flexing zone is formed, for example by a bead of adhesive 32.

Although this process allows effective protection of the scintillator and the connection zone, it nevertheless has some remaining drawbacks.

Firstly, the dimensional constraints on recent technology detectors are such that, in their design, attempts are made to minimize as far as can be done their weight and their bulk. It is therefore necessary to minimize the unuseful zones between the active matrix array of pixels and-the connection zone.

Secondly, since the protection material of the connection zone and the material of the sealing bead of the scintillator are not necessarily of the same nature and compatible with one another, and since the two operations are furthermore independent, the process according to the prior art requires that separate zones dedicated to the two operations be defined on the glass slab. This is therefore detrimental in terms of bulk and increases the fabrication time by increasing the number of operations.

The object of the invention is, on the one hand, to overcome the drawbacks of the prior-art processes which have been summarized and, on the other hand, to meet the needs which are currently felt.

To that end, the process according to the invention makes it possible to produce simultaneous protection of the connection zone and of the scintillator, which protection is obtained by the deposition of a material impermeable to atmospheric moisture. In a preferred alternative embodiment, the deposition is carried out by screen printing.

The invention therefore relates to a process for leaktight sealing of a matrix radiation detector consisting of a glass slab covered with amorphous silicon, the slab comprising at least, on the one hand, a plurality of elementary detectors which are formed on a central zone of an insulating substrate and, on the other hand, a layer of scintillating substance; the said elementary detectors being connected to peripheral connection zones to which flexible multiconductor cables are fixed, characterized in that it comprises at least one step of depositing a layer of material (6, 7) impermeable to atmospheric moisture covering, in a single operation, both the said peripheral connection zones (3) and at least the periphery of the said layer of scintillating substance (24).

The invention also relates to a matrix radiation detector of large size and to a detector obtained by this sealing process.

BRIEF DESCRIPTION OF THE DRAWING

The invention will be understood more clearly, and other characteristics and advantages will become apparent, on reading the description which follows with reference to the appended figures, in which:

FIGS. 1a to 1e schematically illustrate the mode of operation and the structure of a matrix detector on amorphous silicon slab according to the prior art;

FIG. 2 illustrates a first illustrative embodiment of a detector in accordance with the invention;

and FIG. 3 illustrates a second illustrative embodiment of a detector in accordance with the invention.

DETAILED DESCRIPTION OF THE PREFERRED EMBODIMENTS

The process according to the invention will now be described with reference to the embodiments of the detector according to the invention.

FIG. 2 illustrates, in section, a first illustrative embodiment of a detector according to the invention. The elements in common with the detector of FIG. 1e have the same references and will be redescribed only as necessary.

The general structure of a detector as was summarized with reference to FIGS. 1a to 1e is retained. More particularly, the structure of the detector according to the variant in FIG. 2 is similar to that described in relation to the detector of the prior art in FIG. 1e.

The scintillator 24 can be produced by direct evaporation. The component 26 is then a so-called "input" window consisting of a sheet of material impermeable to atmospheric moisture (aluminium, plastic material or glass, for example). The scintillator 24 may also be attached to the slab, as has been described above. The component 26 is then a substrate on which the scintillating substance has been deposited.

According to an important characteristic of the invention, the protection of the peripheral connection zone, on which the ends of the flexible multiconductor cable are fixed, and the protection of the periphery of the scintillator 24 and of its input window 26 are formed in a single operation.

To that end, a material impermeable to atmospheric moisture is deposited. This material covers the flexing zone and extends over the periphery of the scintillator 24 (and of the input window or the substrate 26): sealing bead 6.

The deposition is preferably carried out by screen printing. It may also be carried out using a mechanical dispensing machine, or by any other deposition method or by a combination of the methods above.

FIG. 3 schematically illustrates, in section, a second illustrative embodiment of a detector according to the invention. The structure represented corresponds to the case in which the scintillator 24 is produced by direct evaporation, as has been described above.

The sealing is carried out by the deposition of a layer 7 of a material impermeable to atmospheric moisture over all of the surface of the scintillator 24. The layer 7 overlaps on the periphery, outwards, so as to cover the connection zone 3 aswell and, in particular, the flexing zone 31. This is because it is necessary to protect all of the surface of the scintillator 24, since it does not have any other means of protection.

The deposition proper may be carried out in a manner entirely similar to that which was carried out above: screen printing, etc.

Reading the description above, it is easy to see that the invention does indeed achieve its objects.

The process according to the invention therefore has numerous advantages, including the following: simplicity, lower cost and reduction of bulk.

It should also be clear that, although particularly suited to X-ray detectors of the type mentioned, the invention is not to be confined just to this type of application. It applies equally well to all types of radiation detector having a peripheral connection zone and a scintillator. This may involve an elementary detector or a detector of large size, formed by the assembling of elementary detectors. A detector of the latter type is described, by way of nonlimiting example, in French Patent Application FR-A-2 687 494 (THOMSON TUBES ELECTRONIQUES).

What is claimed is:

1. A method for leaktight sealing a matrix radiation detector of large size having a plurality of elementary detectors which are formed on a central zone of an insulating substrate, said detectors being covered by a layer of scintillating substance that is in turn covered by a radiation window made of a material that permits radiation to be detected to pass there through to impinge on the layer of scintillating substance beneath the radiation window while being impervious to atmospheric moisture, said method comprising:

connecting the elementary detectors to contact pads provided in separate peripheral connection zones outside of said central zone on different peripheral portions of said insulating substrate;

connecting end portions of flexible multiconductor cables to said contact pads; and depositing a sealing layer of material impermeable to atmospheric moisture in a single operation in contact with the contact pads and the end portions of the flexible multiconductor cables at the peripheral connection zones and the periphery of said layer of scintillating substance without covering a central portion of the radiation window so as to seal the contact pads and the end portions of the flexible multiconductor cables together with the periphery of said layer of scintillating substance while leaving another portion of each of the flexible cables extending from the end portions and at least the central portion of the radiation-window free of the deposited layer of material impermeable to atmospheric moisture.

2. The method according to claim 1, wherein the step of depositing the layer of material impermeable to atmospheric moisture is carried out by screen printing.

3. The method according to claim 1, wherein the step of depositing the layer of material impermeable to atmospheric moisture is carried out by using a mechanical dispensing machine.

* * * * *